United States Patent [19]

Shimizu et al.

[11] 4,359,514
[45] Nov. 16, 1982

[54] PHOTOCONDUCTIVE MEMBER HAVING BARRIER AND DEPLETION LAYERS

[75] Inventors: Isamu Shimizu, Yokohama; Shigeru Shirai, Yamato; Eiichi Inoue, Tokyo, all of Japan

[73] Assignee: Canon Kabushiki Kaisha, Tokyo, Japan

[21] Appl. No.: 240,836

[22] Filed: Mar. 5, 1981

[30] Foreign Application Priority Data

Jun. 9, 1980 [JP] Japan ................................. 55-78058

[51] Int. Cl.³ .............................................. G03G 5/14
[52] U.S. Cl. ....................................... 430/65; 427/39; 355/3 DR
[58] Field of Search ................... 430/65, 64; 427/39; 355/3 DR

[56] References Cited

U.S. PATENT DOCUMENTS

| | | | |
|---|---|---|---|
| 4,217,374 | 8/1980 | Ovshinsky | 427/39 |
| 4,226,898 | 10/1981 | Ovshinsky | 427/39 |
| 4,255,222 | 9/1980 | Kempter | 355/3 DR |
| 4,265,991 | 5/1981 | Hirai et al. | 430/64 |

*Primary Examiner*—John D. Welsh
*Attorney, Agent, or Firm*—Fitzpatrick, Cella, Harper & Scinto

[57] ABSTRACT

A photoconductive member which is stable in its electrical and optical characteristics, not influenced by circumstances for its use, and possesses extremely high sensitivity to light, remarkably high anti-photo-fatigue property, and deterioration-resistant against repeated use, the photoconductive member comprising a substrate; a photoconductive layer; a barrier layer between the substrate and the photoconductive layer, and having a function of substantially inhibiting injection of carriers from the substrate side to the photoconductive layer; and a depletion layer region formed in the interfacial region of the photoconductive layer and the barrier layer, wherein the photoconductive layer and the barrier layer are made of an amorphous material with silicon as a matrix and hydrogen as a constituent atom, a part of the barrier layer is present between the depletion layer region and the substrate in such a thickness that, in order to inhibit injection of the carriers having the same polarity as that of minority carriers in the barrier layer from the substrate side to the photoconductive layer, probability of the carrier reaching the depletion layer region from the substrate side may be substantially neglected, and the photocarriers in the photoconductive layer having the same polarity as that of majority carriers in the barrier layer, among the photo-carriers to be generated in the photoconductive layer by irradiation of electromagnetic waves, are caused to move in the direction of the barrier layer.

9 Claims, 4 Drawing Figures

PHOTOCONDUCTIVE MEMBER HAVING BARRIER AND DEPLETION LAYERS

BACKGROUND OF THE INVENTION

1. Field of the Invention

This invention relates to a photoconductive member which is sensitive to electromagnetic waves such as light (in the broad sense of the term, this includes ultraviolet rays, visible light rays, infrared rays, X-rays, γ-rays, and so forth).

2. Description of the Prior Arts

To constitute a photoconductive layer for an electrophotographic image forming member, image original reading device, and so on, used in a television image pick-up tube, solid-state image pick-up device, etc., or in the field of the image forming technique in general, a photoconductive member is required to have various characteristics such as high sensitivity, high S/N ratio (photo-current ($I_p$)/dark current ($I_d$)), a spectral characteristic specific to an electromagnetic wave, with which it is irradiated, harmlessness to human body when it is used, and, in the case of the image pick-up device, capability of readily eliminating a residual image within a set period of time, and so forth. Particularly, in the case of the electrophotographic image forming member to be incorporated in an electrophotographic apparatus used as an office machine, this harmlessness to the human body on its use is of utmost importance.

From such standpoint, amorphous silicon (hereinafter abbreviated as "a-Si") has drawn attention of all concerned in the field of the photoconductive material. At the initial stage of its development, this a-Si from exhibited varying electrical and optical characteristics, because its structure is governed by method and conditions for its manufacture (vide, for example, Journal of Electrochemical Society, Vol. 116, No. 1, pp 77-81, January 1969), hence a serious problem in its reproducibility. In more detail, at the outset of its development, the a-Si film formed by the vacuum evaporation method and the sputtering method had a great deal of defects such as voids, etc., on account of which the electrical and optical properties of the film were seriously influenced. Moreover, little attention had been paid it as the material for studying basic physical properties, nor was there conducted research and development for its applications. However, at the beginning of the year 1976, a report was made for the first time as to possibility of forming a p-n junction in the a-Si, control of the p- and n-type conductivity of which had thereto fore been considered impossible (vide: Applied Physics Letter, Vol. 28, No. 2, pp 105-107, Jan. 15, 1976). Since then, attention has been drawn to this material and strenuous efforts have been exerted in research and development for its application to the solar battery, mainly. As a result of this, a patent has been granted in the United States (i.e., U.S. Pat. No. 4,064,521) for an invention concerning the photoconductive member for the solar battery.

However, since the a-Si film which has so far been reported and the a-Si film of a layer structure as taught in the above-described U.S. patent have been developed for use in the solar battery, they cannot be effectively used as the photoconductive layer for solid-state image pick-up devices, image original reading devices, electrophotographic image forming members, etc. in view of their electrical and optical characteristics.

In other words, according to various experiments done by the present inventors, it has so far been discovered that, while the a-Si film has a number of advantages as the photoconductive layer forming material for the electrophotographic image forming member in comparison with those conventional photoconductive materials such as inorganic photoconductive materials like Se, CdS, ZnO, or organic photoconductive materials (OPC) like poly-N-vinyl carbazole (PVCz) and trinitrofluorenone (TNF), there still are many problems to be solved before a single-layer electrophotographic image forming member formed of the a-Si material which has been developed for the purpose of the solar battery is available. The a-Si film is remarkably fast in its dark decay, even when this a-Si layer is subjected to the charging treatment for the electrostatic image formation. Accordingly the ordinary electrophotographic method is difficult to accomplish. This tendency towards dark decay is considerable in a highly humid atmosphere, and, depending on the case, the a-Si layer is utterly incapable of holding the electric charge.

Apart from the abovementioned electrophotographic image forming member using the a-Si, there has recently been proposed a new type of electrophotographic image forming member, the photoconductive layer of which is made of hydrogenated amorphous silicon (hereinafter abbreviated as "a-Si:H") as disclosed in, for example, DOLS No. 2746967 and DOLS No. 2855718.

The electrophotographic image forming member as disclosed in these prior applications has a number of excellent properties in comparison with the aforementioned electrophotographic image forming member. In other words, the photoconductive layer of either polarity, i.e., p-type or n-type, can be fabricated depending on the manufacturing conditions; the image forming member is prefectly free from liability to environmental pollution; it is excellent in its abrasion-resistant property due to its high surface hardness; it is also excellent in its developer-resistant property; and it is further excellent in its other electrophotographic properties such as cleaning property, moisture-resistant property, and so on.

Even with the a-Si:H type electrophotographic image forming member excellent in its electrophotographic characteristics in various points as mentioned above, there still exist rooms for improvement in respect of is photosensitivity in a practical light quantity region, its γ value, its dark resistivity, its heat-resistant property in a much higher temperature region than a temperature region for ordinary use when conducting a process for improving the characteristics thereof or adding other functions thereto, and its photoresponse property, etc.

The present invention has been made in view of the afore-described various points of problem, and is based on the finding, as the result of continued strenuous efforts in researches and studies from very general standpoints of adaptability and applicability of the a-Si as the photoconductive member for use in the electrophotographic image forming member, the image pick-up device, image original reading device, etc., that, when two layers having mutually different electrical characteristics and comprising an amorphous material with silicon as a matrix and hydrogen as a constituent atom, i.e., hydrogenated amorphous silicon (a-Si:H), are laminated in a particular relationship, the photoconductive member to be obtained is not only useful practically, but also is superior to the conventional photoconductive materials in almost all aspects, in particular, its remarkably superior characteristics as the photoconductive member for electrophotography.

SUMMARY OF THE INVENTION

It is the principle object of the present invention to provide a photoconductive member which is stable in its electrical and optical characteristics, is adaptable to all circumstances without its use being almost restricted by the surroundings, is remarkably superior in its sensitivity and anti-light-fatigue property, and does not bring about deterioration on its repeated use.

It is another object of the present invention to provide a photoconductive member having a high sensitivity to light, covering substantially entire visible light region in its spectral sensitivity region, and being fast in its photo-response.

It is still another object of the present invention to provide a photoconductive member having sufficient chargebearing capability, on its charging treatment for the electrostatic image formation, to such an extent that the ordinary electrophotographic method can be adopted extremely effectively when it is used as the electrophotographic image forming member, and having an excellent electrophotographic characteristics which do not substantially deteriorate even in a highly humid atmosphere.

It is other object of the present invention to provide a photoconductive member for the electrophotography capable of producing high quality image having high density, clear half tone, and high resolution.

It is yet other object of the present invention to provide a photoconductive member for electrophotography with further improvement in the photosensitivity in a practical light quantity region, a $\gamma$ value, and a dark resistivity.

It is further object of the present invention to provide a photoconductive member having excellent photoresponse property and heat-resistant property which enables the process for improving the characteristics thereof or adding other functions thereto to be performed stably even at a high temperature.

According to the present invention, generally speaking, there is provided a photoconductive member which comprises in combination: a substrate for the photoconductive member; a photoconductive layer; a barrier layer provided between the substrate and the photoconductive layer, and having a function of substantially injection inhibiting of carriers from the substrate side to the photoconductive layer; and a depletion layer region created in the interfacial region of the photoconductive layer and the barrier layer, wherein the photoconductive layer and the barrier layer are made of an amorphous material with silicon as a matrix and hydrogen as the constituent atom; a part of the barrier layer is present between the depletion layer region and the substrate in such a thickness that, in order to inhibit injection of the carriers having the same polarity as that of minority carriers in the barrier layer from the substrate side to the photoconductive layer, probability of the carriers reaching the depletion layer region from the substrate side is substantially negligible; of the photocarriers generated in th photoconductive layer by irradiation of electromagnetic waves, those photocarrers having the same polarity as that of majority carriers in the barrier layer are caused to move in the direction of the barrier layer.

The barrier layer has a layer thickness range of from 0.02 to 0.5 micron and contains as impurity to govern the conductive type an atom in Group III-A or V-A of the Periodic Table, and the photoconductive layer has a layer thickness range of from 1 to 70 microns and a resistance value of $5 \times 10^9$ ohm-um, and greater and contains as impurity to govern the conductive type an atom in Group III-A of the Periodic Table, or does not contain such impurity.

DETAILED DESCRIPTION OF PREFERRED EMBODIMENTS

Figure 1:
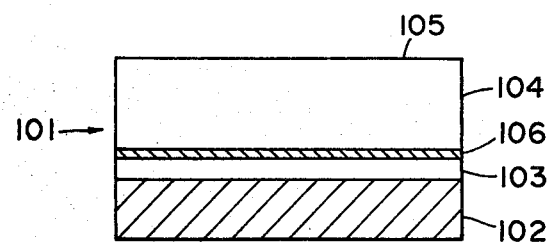
FIGS. 1 and 2 are schematic cross-sectional diagrams showing preferred embodiments of the electrophotographic image forming members according to the present invention.

In order to effectively attain the purpose of the present invention, the photoconductive member is so constructed that the barrier layer and the photoconductive layer are laminated onto a substrate for the photoconductive member in a specified layer relationship to be described in detail hereinbelow, and that each of the layers is selected in a favorable combination from various types of a-Si:H having the semiconductive characteristics as shown below.

(1) $p^-$-type a-Si:H ... containing acceptor alone at a low concentration, or both donor and acceptor with the acceptor concentration (Na) being slightly higher than the donor concentration;

(2) $p^+$-type a-Si:H ... containing the acceptor along at a concentration higher than that of the type (1), or both donor and acceptor with the acceptor concentration (Na) being higher than the donor concentration (Nd), and the donor concentration per se being considerably high;

(3) $n^-$-type a-Si:H ... containing the donor alone at a low concentration, or both donor and acceptor with the donor concentration (Nd) being alightly higher than the acceptor concentration (Na);

(4) $n^+$-type a-Si:H ... containing the donor alone at a concentration higher than that of the type (3), or both donor and acceptor with the donor concentration (Nd) being higher than the acceptor concentration (Na), and the donor concentration (Nd) per se being considerably high; and (5) i-type a-Si:H ... having a relationship of Na$\simeq$Nd$\simeq$O or Na$\simeq$Nd.

The layer of the a-Si:H selected from any of these five types as mentioned in the preceding is obtained by doping or not doping it with a required quantity of an impurity to govern the conductivity type as it fabrication, whereby the layer comprising each type of a-Si:H can be obtained.

In the present invention, the impurity as dopant is selected from those atoms in Group III-A of the Periodic Table such as, for example, B, Al, Ga, In, Tl, etc, as the acceptor forming impurity, and those atoms in Group V-A of the Periodic Table such as, for example, N, P, As, Sb, Bi, etc. as the donor forming impurity.

The doping quantity of these impurities into each layer should preferably range, in ordinary case, from 100 ppm to 1,000 ppm, or more preferably, from 150 ppm to 500 ppm of the atoms in Group III-A of the Periodic Table as the p-type impurity to render the layer to be of the type (2), i.e., p+-type. For obtaining the type (4), i.e., the n+-type, the atoms in Group V-A of the Periodic Table may be doped as the n-type impurity in an amount of from 100 ppm to 1,000 ppm, or more preferably, from 150 ppm to 500 ppm. To obtain the photoconductive layer of the types (1), (3), and (5), i.e., p−-type, n−-type, and i-type, respectively, no impurity to govern the conductive type is doped, or the p-type impurity is doped in an amount not reaching 100 ppm. Distinction among the p−, n−, and i conductive types depends on the manufacturing conditions, and they gradually change from the n−-type to the i-type, and further to the p−-type in the abovementioned region of the doping quantity.

In order that the photoconductive member of the present invention may operate more effectively, it is desirable that the ratio between the doping quantity in the photoconductive layer and that in the barrier layer be set as follows. For a value satisfying a relationship of N-M/N (where M(ppm) is a doping quantity of the impurity governing the conductivity in the photoconductive layer, and N(ppm) is a doping quantity of the impurity governing the conductivity type in the barrier layer), a range of 0.5 to 1.0 in an ordinary case, or more preferably from 0.75 to 1.0, or optimumly from 0.9 to 1.0, is selected.

Table 1 below shows favorable combinations of the a-Si:H for constituting both photoconductive layer and barrier layer meeting the purpose of the present invention.

TABLE 1

| Layer | Type | | | | | |
|---|---|---|---|---|---|---|
| | A | B | C | D | E | F |
| Photoconductive Layer | (3) | (1) | (5) | (3) | (1) | (5) |
| Barrier Layer | (4) | (4) | (4) | (2) | (2) | (2) |

The photoconductive member having such layer structure as shown above is capable of solving all the problems mentioned in the foregoing, and can exhibit extremely superior electrical, optical, and photoconductive characteristics. Particularly, when this photoconductive member is used for electrophotographic image forming member, there can be obtained a highly quality image which is excellent in its charge bearing capability at the time of charging treatment, stable in its electrophotographic characteristics even in a highly humid atmosphere, highly sensitive to light, excellent in its anti-photo-fatigue property and repetitive use, high in its density, capable of producing clear half tone, and has high resolution. Further, when this photoconductive member is used for the electrophotographic image forming member, the a-Si:H of high dark resistance exhibits a low photosensitivity, while the a-Si:H of high photosensitivity exhibits its dark resistance as low as $10^8$ ohm-cm or so. Therefore, in either case of using the photoconductive member having high dark resistance or high photosensitivity, conductive layer of the conventional structure could not adopt a-Si:H for the electrophotographic image forming member as it is. In contrast to this, the photoconductive layer of the present invention can be constructed with a-Si:H of a relatively low resistance ($5 \times 10^9$ ohm-cm and above), hence the a-Si:H having a relatively low resistivity but high photo-sensitivity is sufficiently useful and restrictions imposed on the characteristics of the a-Si:H can be reduced.

The optimum combinations of the a-Si:H from among those in Table 1 for the purpose of the present invention are the types C and F, in which cases the photoconductive member possesses highly excellent electrophotographic characteristics, so that when it is used as the electrophotographic image forming member, the best results can be obtained.

In the present invention, when the photoconductive layer and the barrier layer are laminated as mentioned in the foregoing, the a-Si:H of a lower resistance than that of the conventional ones can be used to constitute the photoconductive layer. In order, however, to obtain more favorable result, the dark resistance of the photoconductive layer to be formed should desirably be $5 \times 10^9$ ohm-cm and above, or optimumly, $1 \times 10^{10}$ ohms-cm and above.

The barrier layer, on the other hand, is constructed with a material having small mobility ($\mu$) to minority carriers so that injection into the photoconductive layer of carriers having the same polarity as that of the minority carriers in the barrier layer from the side of the substrate may be effectively inhibited, and that, of the photo-carriers to be generated in the photoconductive layer by irradiation of electromagnetic waves, the photo-carriers having the same polarity as that of majority carriers in the barrier layer may be effectively propagated through the photoconductive layer.

Further, when the barrier layer and the photoconductive layer are laminated in those combinations as shown in Table 1, there is created a depletion layer region at the interfacial region between them. In this instance, the lower limit of the barrier layer thickness is so restricted that one end of this depletion layer region may not reach, to a substantial extent, the barrier layer surface opposite to the junction between it and the photoconductive layer. The lower limit of thickness of the barrier layer is determined on the basis of thickness of the depletion layer to be created. However, since the thickness of the depletion layer depends on field intensity relative to the depletion layer and impurity concentration in both photoconductive layer and barrier layer to be junctioned, the lower limit of thickness of the barrier layer can also be determined from those values of the impurity concentration and the field intensity so that the photoconductive member having desired characteristics may be formed.

In the present invention, the lower limit of thickness of the barrier layer is determined as mentioned above. Specific value of the layer thickness for attaining the intended purpose of the present invention should preferably be 0.02 micron in ordinary case, and, more preferably 0.05 micron.

The upper limit of thickness of the barrier layer also makes one of the important factors to effectively attain the objective of the present invention. If the thickness of the barrier layer is sufficient large, mobility of the majority carriers to be generated in and propagated through the barrier layer adversely affects mobility in the photoconductive layer of the photo-carriers having the same polarity as that of the majority carriers in the barrier layer and to be generated in the photoconductive layer by irradiation of electromagnetic waves. This results in inability of the photoconductive layer to effectively achieve its functions. Accordingly, the upper limit of thickness of the barrier layer should be so determined that such adverse effect as mentioned above may not substantially take place, or, if any, may almost be neglected. For the upper limit of thickness of the barrier layer, it should desirably be 0.5 micron in ordinary case, or more desirably 0.3 micron.

The layer thickness of the photoconductive layer for the photoconductive member according to the present invention may be appropriately determined as desired in conformity to the purpose, for which the photoconductive member is used, such as reading device, image pick-up device, electrophotographic image forming member, and so forth. In other words, the layer thickness of the photoconductive layer according to the present invention should appropriately be determined in relation to the layer thickness of the barrier layer so that the functions of the photoconductive layer and the barrier layer may be made much use of, and that the purpose of the present invention may be effectively attained. In ordinary case, the layer thickness should preferably be some tens of times as thick as that of the barrier layer. More specifically, it should desirably be in a range of from 1 to 70 microns, or more desirably from 2 to 50 microns.

In the present invention, in order to construct the photoconductive layer and the barrier layer with a-Si:H, hydrogen is introduced in these layers at the time of their formation by any of the following methods. (It is to be noted here that the expression "hydrogen is contained in the layer" signifies "a state, in which hydrogen is combined with silicon", or "a state, in which hydrogen is ionized and taken into the layer", or "a state, in which hydrogen molecules are taken in the layer", or combination of these states.

The method for introducing hydrogen into the photoconductive layer and the barrier layer is as follows: at the time of forming these layers, a silicon compound in a gaseous form or in a readily gassifiable form such as silanes like $SiH_4$, $Si_2H_6$, $Si_3H_8$, $Si_4H_{10}$, etc. is introduced into a deposition device, and then the compound is decomposed by the glow discharge decomposition method, whereby hydrogen is contained in the layers along with their growth.

In case the photoconductive layer and the barrier layer are formed by the glow discharge method, hydrogen is automatically included in these layers, when they are formed from the starting material of a-Si, due to decomposition of hydrogenated silicon gas such as $SiH_4$, $Si_2H_6$, etc.

Besides the glow discharge method, the reactive sputtering method is also effective for forming the photoconductive layer and the barrier layer for the purpose of the present invention.

In the case of the reactive sputtering method, it may suffice that hydrogen gas or a hydrogenated silicon gas such as $SiH_4$, $Si_2H_6$, $Si_3H_8$, $Si_4H_{10}$, etc., or a gas such as $B_2H_6$, $PH_3$, etc. for dual purposes of introducing hydrogen as well as doping impurity is introduced into a deposition chamber, wherein the sputtering is effected by using silicon as a target in an atmosphere of an inactive gas such as argon, etc. or a mixture gas with such inactive gas as a base.

According to knowledge and finding of the present inventors, it has been found that the hydrogen content in the photoconductive layer and the barrier layer made of a-Si:H constitutes one of the important factors to govern applicability, in the practical aspect, of the resulting photoconductive member, hence it is of extreme significance. In order that the photoconductive member to be obtained may be sufficiently applicable in the practical aspect, the hydrogen content in each of the photoconductive layer and the barrier layer should desirably range from 1 to 40 atomic %, or more preferably from 5 to 30 atomic %.

Control of the hydrogen content in each layer may be done by, for example, regulating a temperature of the substrate, on which the deposition is to be effected, or a quantity of a starting material to be introduced into the deposition device for inclusion of hydrogen, or both, and a discharging power as well.

In the following, the present invention will be explained with reference to a case, wherein the photoconductive member is used as the electrophotographic image forming member to be adopted for effecting the electrophotographic method.

Figure 2:
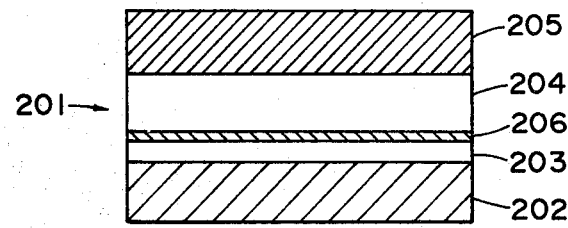

FIGS. 1 and 2 illustrate representative structures of the electrophotographic image forming members. The member 101 shown in FIG. 1 comprises a substrate 102 for the image forming member, a barrier layer 103 provided on the substrate, and a photoconductive layer 104 having a free surface 105. The photoconductive layer 104 is sensitive to electromagnetic waves irradiated thereonto and produces mobile photo-carriers by excitement of the electromagnetic waves. The barrier layer 103 is capable of effectively inhibiting injection into the photoconductive layer 104 of the carriers having the same polarity as that of minority carriers present in the photoconductive layer.

The photoconductive layer 104 has a function of generating the mobile photo-carriers by the action of the electromagnetic waves irradiated thereonto during the electromagnetic wave irradiating step which is one of the process steps for forming an electrostatic image in the image forming member 101.

A depletion layer 106 is created at an interfacial region at the junction of the barrier layer 103 and the photoconductive layer 104.

The substrate 102 may be either electrically conductive or electrically insulative. Examples of the electrically conductive substrate are: metals such as NiCr, stainless steel, Al, Cr, Mo, Au, Ir, Nb, Ta, V, Ti, Pt, Pd, and so forth, or alloys of these metals. Examples of the electrically insulative substrate are: film or sheet of synthetic resins such as polyester, polyethylene, polycarbonate, cellulose acetate, polypropylene, polyvinyl chloride, polyvinylidene chloride, polystyrene, polyamide, and so forth. Besides these, there may usually be used glass, ceramics, paper, etc. It is desirable that these electrically insulative substrate be preferably subjected to electrically conductive treatment on at least one surface side thereof, and other layer be provided on this electrically conductive surface side. For instance, in the case of glass, its surface is subjected to electrically conductive treatment with a thin film of NiCr, Al, Cr, Mo, Au, Ir, No, Ta, V, Ti, Pt, Pd, $In_2O_3$, $SnO_2$ITO ($In_2O_3$ and $SnO_2$), and so forth. In the case of the synthetic resin film such as polyester film. etc., its surface is treated with metals such as NiCr, Al, Ag, Pb, Zn, Ni, Au, Cr, Mo, Ir, Nb, Ta, V, Ti, Pt, and so forth by means of the vacuum evaporation method, the electron beam evaporation method, sputtering method, and so on. Or, the abovementioned metals are laminated on one surface of the electrically insulative substrate to render it electrically conductive.

The shape of the substrate may be arbitrarily determined as desired such as in the form of cylinder, belt, flat plate, etc. In the case of continuous, high speed reproduction, it is desirable that the substrate be in an endless belt form or cylindrical form.

Thickness of the substrate may be arbitrarily determined so as to obtain the image forming member as desired. In case, however, the image forming member is required to have flexibility, it should be made as thin as possible within such an extent that its function as the substrate may be sufficiently preserved. In such case, the thickness may usually be 10 microns and above from the standpoint of manufacturing and handling of the substrate as well as its mechanical strength, etc.

FIG. 2 illustrates the electrophotographic image forming member 201 of a different layer structure. This image forming member is not essentially different in structure from the electrophotographic image forming member 101 shown in FIG. 1 with the exception that the surface coating layer 205 is provided on the surface of the photoconductive layer 204. In other words, the electrophotographic image forming member 201 in FIG. 2 is composed of the substrate 202, on which the barrier layer 203 and the photoconductive layer 204 are laminated in the order as mentioned, the depletion layer 206 being created at the interfacial region between the barrier layer 203 and the photoconductive layer 204 at their junction. Materials for forming these layers, conditions for their fabrication, thickness of these layers, and so forth are same as in the case if the image forming member shown in FIG. 1. The characteristics required of the surface coating layer 205 provided on the photoconductive layer 204 differs from one electrophotographic process to another to be adopted. For example, when the electrophotographic process such as the NP process as taught in USP 3,666,363 and USP 3,743,609 is adopted, the surface coating layer 205 is required to be electrically insulative, has sufficient electrostatic charge bearing capability when it is subjected to the charging process, and has a layer thickness of a certain degree or above. However, when the electrophotographic process such as, for example, the Carlson process, is adopted, the electric potential at the bright portion of the image after formation of an electrostatic image should desirably be very small, hence thickness of the surface coating layer 205 is required to be very thin. In addition to its satisfying desired electrical characteristics, the surface coating layer 205 may be formed in consideration of its not giving chemical and physical defects to the photoconductive layer 204, of its electrical contact property and adhesive property to the layer 204, and further of its moisture-resistant property, abrasion-resistant property, cleaning property, etc.

Representative examples of the forming material to be effectively used for the surface coating layer 205 are: polyethylene terephthalate, polycarbonate, polypropylene, polyvinyl chloride, polyvinylidene chloride, polyvinyl alcohol, polystyrene, polyamide, polytetrafluoroethylene, polytrifluoroethylene chloride, polyvinyl fluoride, polyvinylidene fluoride, copolymers of hexafluoroethylene and tetrafluoroethylene, copolymers of trifluoroethylene and vinylidene fluoride, polybutene, polyvinyl butyral, polyurethane, poly-para-xylylene, and other organic insulative substances; and silicon nitrides, silicon oxides and other inorganic insulative substances. These resins or cellulose derivatives may be shaped into a film form and adhered onto the photoconductive layer 204, or they are rendered liquid, and coated on the photoconductive layer 204 for the layer formation. Thickness of the surface coating layer 205 may be arbitrarily determined depending on the characteristics as desired, or the quality of the material to be used. Usually, it ranges from 0.5 to 70 microns or so. In particular, where the surface coating layer 205 is required to have the function as the afore-mentioned protective layer, the thickness may be 10 microns or below in the ordinary case, and, where it is required to have the function as the electrically insulative layer, the thickness may be 10 microns and above in the ordinary case. It should, however, be noted that the value of the layer thickness to distinguish the protective layer and the electrically insulative layer is subject to variations due to the material to be used, the electrophotographic process to be adopted, and the structure of the image forming member to be designed, hence the above-mentioned value of 10 microns is not absolute. It should also be noted that the surface coating layer 205 will expand its function and effect when it is given an additional function as a reflection preventive layer.

For the purpose of effectively utilizing its characteristics, the image forming member according to the present invention is subjected to the charging treatment on its free surface, when an electrostatic image is to be formed, by the Carlson process, by selecting a charge polarity in such a matter that a voltage which constitutes a reverse bias (a bias voltage in the reverse direction) may be applied to the depletion layer 206. When the electrostatic image is to be formed by the NP process, the image forming member is subjected to the charging treatment on its free surface by selecting a charge polarity in such a manner that a voltage which constitutes a forward bias (a bias voltage in the forward direction) may be applied to the depletion layer 206, followed by selection of a charge polarity opposite to that in the first step.

Since, according to the present invention, the photoconductive layer (104, 204) and the barrier layer (103, 203) are made of the same material, and the depletion layer (106, 206) is created at the junction of the barrier layer and the photoconductive layer, there is further derived an advantage such that the layers can be formed in a continuous manufacturing steps.

EXAMPLE 1

Figure 3:
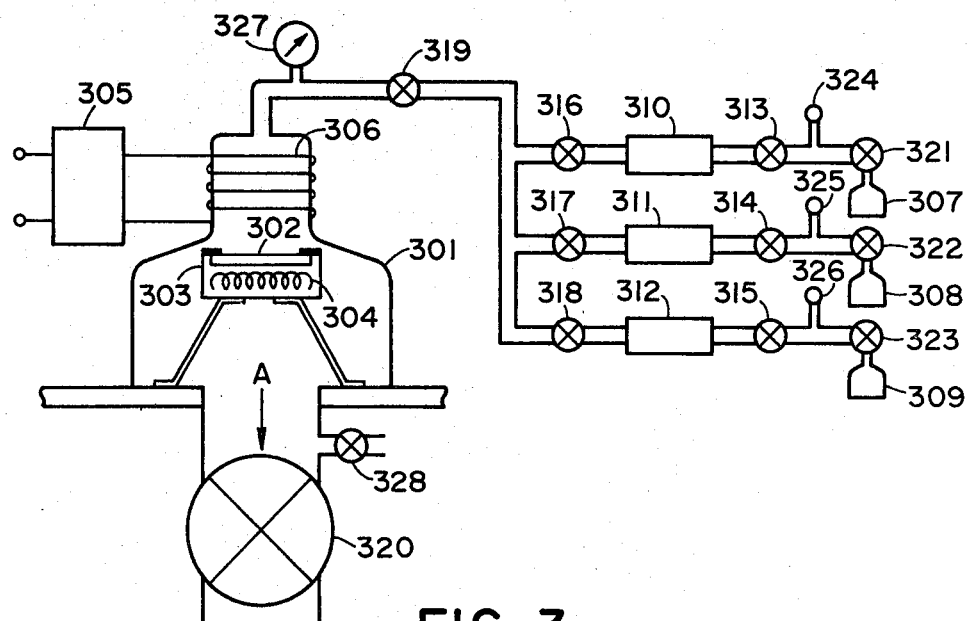
FIGS. 3 and 4 are schematic explanatory diagrams of the devices for fabricating the photoconductive member according to the present invention.

A vacuum deposition device as shown in FIG. 3 was installed in a perfectly sealed clean chamber. Using this device, the electrophotographic image forming member was fabricated by the operational steps to be mentioned hereinbelow. A glass substrate 302 (a product of Dow Corning Co., U.S.A., available under a commodity code of #7059) having a dimension of 100 mm × 100 mm × 0.2 mm and with its surface having been cleaned and subjected to the electrically conductive treatment by providing an NiCr layer of 700 Å thereon was fixedly secured on a fixing member 303 at a predetermined position in a glow discharge deposition chamber 301. The substrate 302 was heated by a heater 304 incorporated within the fixing member 303 with a precision of ±0.5° C. The temperature of the substrate was directly measured from the back surface of the substrate by means of a thermocouple (alumel-chromel). After verifying that all valves in the system were closed, the main valve 320 was made full open to evacuate the chamber 301 to a vacuum degree of approximately $5 \times 10^{-6}$ torr. Thereafter, the input voltage to the heater 304 was increased, and, while detecting the temperature of the glass substrate 302, the input voltage was varied until the substrate attained a constant temperature value of 200° C.

After this, an auxiliary valve 319, and subsequently flow-out valves 316, 317, 318 and flow-in valves 313, 314, 315 were made full open to thereby sufficiently evacuate the flow meters 310, 311, and 312. After closure of the flow-out valves 316, 317, 318, a valve 321 of a bomb 307 containing therein silane gas (99.999% purity) as diluted with argon so as to have a silane concentration of 10 vol.% based on the total volume was opened to regulate a pressure at an outlet pressure gauge 324 to 1 kg/cm$^2$. Then, by gradually opening the flow-in valve 313, SiH$_4$ gas was introduced into the flow meter 310. Subsequently, the flow-out valve 316 was gradually opened, and then the auxiliary valve 319 was also opened gradually. While monitoring the Pirani gauge 327, the opening of the auxiliary valve 319 was adjusted until the deposition chamber 301 attained the vacuum degree of $1 \times 10^{-2}$ torr.

Next, a valve 322 of a bomb 308 filled with B$_2$H$_6$ (99.999% purity) as diluted with argon so as to be a B$_2$H$_6$ concentration of 10 vol.% based on the total volume was opened to regulate a pressure at an outlet pressure gauge 325 to 1 kg/cm$^2$. By gradually opening the flow-in valve 314, B$_2$H$_6$ gas was introduced into the flow meter 311. Subsequently, the flow-out valve 317 was gradually opened to adjust a concentration ratio of B$_2$H$_6$ to SiH$_4$ in a gas flowing into the deposition chamber 301 to be 350 vol. ppm.

As soon as the internal pressure of the deposition chamber 301 became stabilized, the main valve 320 was gradually constricted until the Pirani gauge 327 indicated 0.5 torr. Upon verification of stabilization of the internal pressure in the deposition chamber 301, a high frequency power source 305 was switched on to supply a high frequency power of 13.56 MHz to an induction coil 306 to generate glow discharge within the deposition chamber 301 at a coil portion provided on the upper part of the chamber, thereby obtaining an input power of 30 W. The abovementioned conditions were maintained for four minutes to cause a p$^+$-type Si:H layer to grow on the glass substrate 302, after which the high frequency power source 305 was switched off to cease the glow discharge. In this state, the flow-out valve 317 of the B$_2$H$_6$ gas bomb 308 was gradually constricted to adjust the concentration ratio of B$_2$H$_6$ to SiH$_4$ in the gas flowing into the deposition chamber 301 to become 10 vol. ppm.

Upon stabilization of the gas within the deposition chamber 301, the high frequency power source 305 was again switched on to resume the glow discharge. In this way, the glow discharge was maintained for additional 1.5 hours to form an i-type a-Si:H layer over the p$^+$-type a-Si:H layer. Thereafter, the heater 304 was turned off, and the high frequency power source 305 was also switched off. As soon as the substrate temperature indicated 100° C., the flow-out valves 316, 317 were closed, while the main valve 320 was made full open, to evacuate the interior of the deposition chamber 301 to be $10^{-5}$ torr or below. After this, the main valve 320 was closed and the interior of the deposition chamber 301 was rendered atmospheric by gradual opening of a lead valve 328, and the substrate was taken out. The thus obtained sample was designated an image forming member A. In this case, the total thickness of the layer formed was approximately 4.2 microns (p$^+$-type a-Si:H layer being approx. 0.2 micron, and i-type a-Si:H layer being approx. 4 microns).

The thus obtained image forming member A was placed in an experimental device for charging and exposing, and subjected to a corona charging with a voltage of +6KV for 0.2 sec. immediately followed by irradiation of light image. The light image was irradiated by passing a visible light of 1.5 lux·sec. through a transmission type test chart using a halogen lamp of 34,000K as a light source and a filter VG-54 (manufactured by Tokyo Shibaura Electric Co. Ltd., Japan). Thereafter, a negatively charged developing agent (containing toner and carrier) was cascaded on the surface of the image forming member A, thereby obtaining a good toner image on it. When the toner image on the image forming member A was transferred on to an image transfer sheet with a corona charging of +5KV, there could be obtained a clear image of high density which was excellent in its image resolution and reproducibility of gradation.

Also, a toner image was formed by use of the same image forming member A and the negatively charged developer with the exception that, instead of the above-mentioned VG-54 filter, each of three color filters B(blue), G(green) and R(red) was used and the corona charging of +6KV was done. In each case, substantially satisfactory image could be obtained on the image transfer sheet.

EXAMPLE 2

Figure 4:
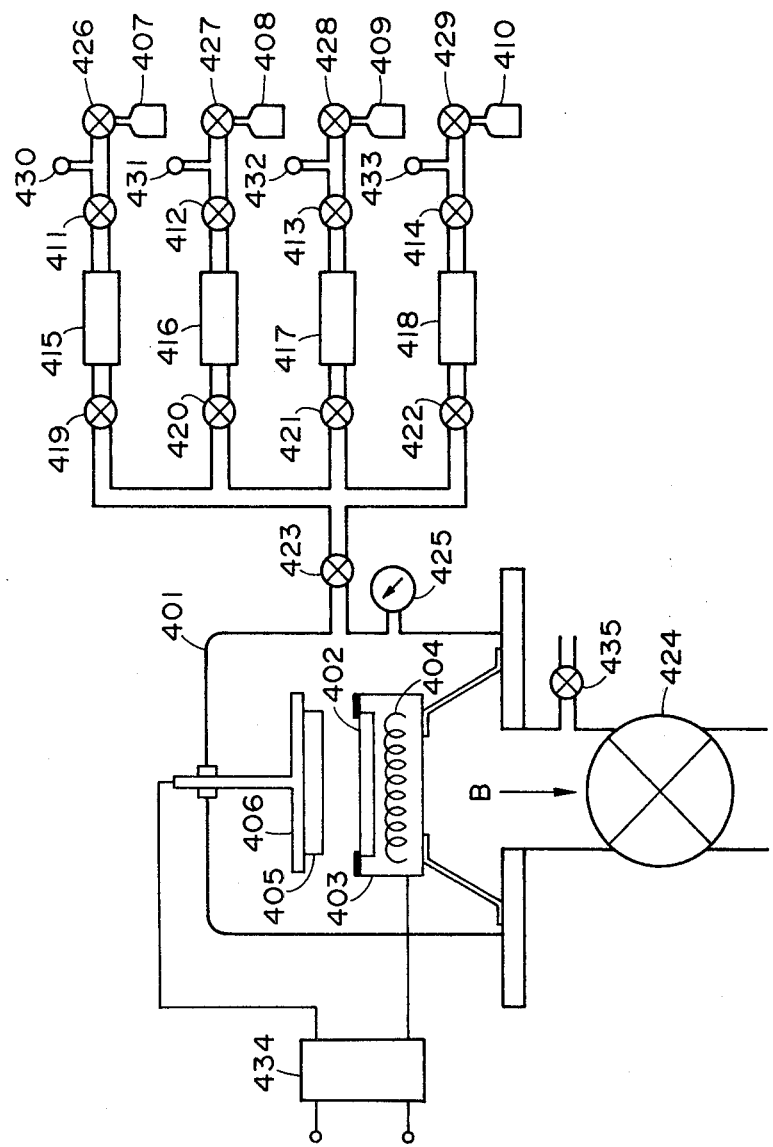

Using the reactive sputtering deposition device shown in FIG. 4, the electrophotographic image forming member according to the present invention was manufactured in the manner to be mentioned hereinbelow.

A substrate was fabricated by electron beam vacuum evaporative deposition of a platinum thin film to a thickness of approximately 800Å on a stainless steel plate having a dimension of 100 mm × 100 mm × 0.2 mm, the surface of which has been cleaned beforehand. The substrate 402 was firmly fixed on a fixing member 403 with a heater 404 and a thermocouple being incorporated therein, and installed within the reactive sputtering deposition chamber 401. A poly-crystalline silicon plate target 405 (99.999% purity) was fixed on an electrode 406 opposed to the substrate 402 in such a manner that the target may be opposed to, but in parallel with, the substrate 402 at a space interval of approximately 4.5 cm between them.

Subsequently, interior of the deposition chamber 401 was once evacuated to a degree of $5 \times 10^{-7}$ torr by full-opening of the main valve 424 (at this time, the entire valves in the system are closed). Then, an auxiliary valve 423 and flow-out valves 419, 420, 421 and 422 were opened to sufficiently deareate interior of flow meters 415, 416 417 and 418, after which the flow-out valves 419, 420, 421 and 422 and the auxiliary valve 423 were closed.

The substrate 402 was heated by the heater and maintained at 200° C. Then, a valve 426 of a bomb 407 containing therein hydrogen (99.999% purity) was opened, and outlet pressure was regulated to 1 Kg/cm$^2$ while monitoring an outlet pressure gauge 430. Subsequently, a flow-in valve 411 was gradually opened to cause hydrogen gas to flow into a flow meter 415, and then a flow-out valve 419 and an auxiliary valve 423 were also opened gradually.

Next, the internal pressure of the deposition chamber 401 was adjusted to a vacuum degree of $5 \times 10^{-5}$ torr by regulating the flow-out valve 419, while it is being monitored by a pressure gauge 425. Subsequently, a valve 427 of a gas bomb 408 filled with argon (99.999% purity) was opened to adjust the outlet pressure gauge so that it may indicate 1 Kg/cm$^2$ after which a flow-in valve 412 was opened and then a flow-out valve 420 was gradually opened, thereby introducing argon gas into the deposition chamber 401. The flow-out valve 420 was gradually opened until the pressure gauge 425 within the deposition chamber indicated $5 \times 10^{-4}$ torr. In this state, as soon as the flow rate of the gas became stabilized, the main valve 424 was gradually constricted until the pressure within the deposition chamber attained $1 \times 10^{-2}$ torr. Subsequently, a valve 429 of a bomb 410 filled with PH$_3$ gas (99.999% purity) was opened, an outlet pressure gauge 433 was adjusted to 1 Kg/cm$^2$, a flow-in valve 414 was opened, and a flow-out valve 422 was gradually opened, and further while a flow-meter 418 was observed, the flow rate of PH$_3$ gas was controlled to a rate of approximately 1.5% based on the hydrogen flow rate indicated by the flow meter 415. Verifying that the flow meters 415, 416 and 418 had become stabilized, a high frequency power source 434 was switched on to apply an input a.c. power of 13.56MHz 1.6KV across the target 405 and the fixing member 403. Under this condition, the layer was formed while taking a matching in such a manner that a stable discharge may be continued. In this way, electric discharge was continued for 2.5 minutes, thereby forming the n$^+$-type a-Si:H barrier layer having a thickness of 0.15 micron. Thereafter, the high frequency power source 434 was switched off to once stop the discharging. Subsequently, the flow-out valves 419, 420 422 were closed and the main valve 424 was made full open to evacuate the interior of the deposition chamber 401 until it attained the vaccum degree of $5 \times 10^{-7}$ torr. Thereafter, as is the case with formation of the barrier layer, both hydrogen and argon gases were introduced, and opening of the main valve 424 was adjusted to render the internal pressure of the deposition chamber to be $2 \times 10^{-2}$ torr. Subsequently, a valve 428 of a bomb 409 filled with B$_2$H$_6$ gas (99.999% purity) was opened and the outlet pressure was so adjusted that the outlet pressure gauge 432 indicated 1 kg/cm$^2$. Then, the flow-in valve 413 was opened, followed by gradual opening of the flow-out valve 421 to regulate flow rate of B$_2$H$_6$ gas to be 0.6% based on the hydrogen flow rate by observing the flow meter 417. Upon stabilization of the flow rates of hydrogen, argon, and diborane gases, the high frequency power source 434 was switched on again to apply power of 1.6 KV, thereby resuming the electric discharge. Under this condition, discharging was continued for three hours to form the p$^-$-type a-Si:H layer having a thickness of 10 microns. Thereafter, the high frequency power source 434 and the power source for the heater 404 were turned off. As soon as the substrate temperature lowered to 100° C. or below, the flow-out valves 419, 420 and 421 were closed, and the auxiliary valve 423 was also closed, after which the chamber interior was de-gassed by full opening of the main valve 424. Thereafter, the main valve 424 was closed, and the leak valve 435 was opened to render the internal pressure of the chamber 401 to be atmospheric, and the substrate was taken outside. This sample was designated an image forming member B.

Using the thus obtained image forming member B, a toner image was formed. In combined use of the negative corona charging of 6 KV and the positively charged developer, the image obtained was excellent in its image resolution, gradation, and image density.

EXAMPLE 3

On one cleaned surface of Corning #7059 glass (having a dimension of 40 cm $\times$ 40 cm $\times$ 1 mm, both surfaces being polished), there was evaporatively deposited ITO (In$_2$O$_3$:SnO$_2$=20:1, shaped and calcined at 600° C.) to a thickness of 1,200 Å by the electron beam vapor deposition, followed by heat-treatment at 500° C. in an oxygen atmosphere, thereby obtaining a substrate for the image forming member.

This substrate was placed on the fixing member 303 of the apparatus as used in Example 1 above (FIG. 3) with the ITO-deposited surface turned outside. Subsequently, the interior of the flow discharging deposition chamber 301 was evacuated to $5 \times 10^{-6}$ torr by the same operation as done in Example 1. While maintaining the substrate temperature at 170° C., SiH$_4$ gas was caused to flow into the deposition chamber, and the chamber interior was adjusted to a value of 0.8 torr. Further, B$_2$H$_6$ gas was introduced into the deposition chamber 301, in mixture with SiH$_4$ gas, from the B$_2$H$_6$ gas bomb 308 through the valve 322 at a gas pressure of 1 kg/cm$^2$ (reading of the outlet pressure gauge 325) while the flow-in valve 314 and flow-out valve 317 were regulated so that the ratio of B$_2$H$_6$/SiH$_4$ might be 350 vol. ppm, in accordance with indication of the flow meter 311. As soon as the in-flow gas became stabilized, the internal pressure of the deposition chamber became constant, and the substrate temperature became stabilized at 170° C., the high frequency power source 305 was turned on, in the same manner as in Example 1 above, to start the glow discharging. Under this condition, the glow discharging was continued to form the p$^+$-type a-Si:H layer having a thickness of 0.15 micron, after which the high frequency power source 305 was switched off to cease the glow discharge and terminate formation of the p$^+$-type a-Si:H layer. Thereafter, both flow-out valves 316, 317 were closed, and the auxiliary valve 319 and the main valve 320 were made full open to evacuate the interior of the deposition chamber 301 to the vacuum degree of $5 \times 10^{-6}$ torr. Then, the auxiliary valve 319 and the main valve 320 were closed, while gradually opening the flow-out valve 316, the same flow rate of SiH$_4$ gas as that at the time of formation of the abovementioned p$^+$-type a-Si:H layer was reinstated by regulating the auxiliary valve 319 and the main valve 320. Again, the high frequency power source 305 was switched on to resume the glow discharging. After forming the n$^-$-type a-Si:H layer having a thickness of 10 microns by maintaining the abovementioned state, the heater 304 and the high frequency power source 305 were switched off. As soon as the substrate temperature lowered to 100° C. or below, the flow-out valve 316 was closed, while the main valve 320 and the auxiliary valve 319 were made full open to once evacuate the interior of the chamber 301 to the vacuum of $10^{-5}$ torr or below. After this, the main valve 320 was closed to render chamber interior to be atmospheric by means of the leak valve 328, and the substrate was taken outside. In this way, the image forming member C was fabricated.

Using the thus obtained image forming member C, the image forming test was conducted. In the combined use of the positive corona charge of 6 KV, exposure from the back surface, and negatively charged developer, there could be obtained a very favorable image.

EXAMPLE 4

In the same manner as in Example 3 above, the n+-type a-Si:H layer and the p−-type a-Si:H layer were formed on the glass substrate (Corning #7059) coated on its surface with ITO by vapor deposition, under the conditions and following the procedures to be mentioned hereinbelow.

The substrate was placed on the fixing member 303 with the ITO-deposited surface being turned outside as is the case with Example 1 above. Subsequently, the interior of the glow discharge chamber 301 was evacuated to a vacuum degree of $5 \times 10^{-6}$ torr by the same operation as in Example 1. The substrate was maintained at a temperature of 170° C. Then, the valve 321, the flow-in valve 313 and the flow-out valve 316 were opened, to introduce $SiH_4$ gas as diluted with argon to give a concentration of 10 vol.% based on the total volume into the deposition chamber 301. While maintaining this state, a valve 323, a flow-in valve 315 and a flow-out valve 318 were opened, followed by introduction into the deposition chamber 301 of $PH_3$ gas as diluted with argon so as to have a concentration of 10 vol.%, from a bomb 309. At this instant, the opening and closing of the flow-in valve 315 and the flow-out valve 318 were adjusted, while watching the flow meter 312, so that the ratio of $PH_3$ to $SiH_4$ might be 250 vol. ppm.

Upon stabilization of the gas pressure within the deposition chamber 301, the high frequency power source 305 was switched on, and the glow discharging was started. By maintaining the glow discharging under this condition, the n+-type a-Si:H layer having a thickness of 0.15 micron was formed on the substrate.

Successively, the high frequency power source 305 was turned off, while the heater 304 for the substrate was kept turned on. Next, the valve 322 of the $B_2H_6$ gas bomb 308 was opened to adjust a pressure in the outlet pressure gauge 325 to 1 kg/cm², and then the flow-in valve 314 was gradually opened to cause $B_2H_6$ gas to flow into the flow meter 311. Further, the flow-out valve 317 was gradually opened, and, while monitoring the flow meter 311, the opening of the flow-out valve 317 was so set that the ratio of $B_2H_6$ to $SiH_4$ may be 50 vol. ppm, until the $B_2H_6$ flow rate into the chamber 301 became stabilized along with that of $SiH_4$ gas. Subsequently, the high frequency power source 305 was again switched on to start the glow discharge, and it was continued under this condition to form the p−-type a-Si:H layer having a thickness of 10 microns. Thereafter, the heater 304 and the high frequency power source 305 were turned off, and the substrate temperature was lowered to 100° C. After this, the flow-out valves 316, 317 were closed and the main valve 320 was made full open to once evacuate the interior of the deposition chamber 301 to a vacuum degree of $10^{-5}$ torr, after which the main valve 320 was closed and the leak valve 328 was opened to render the chamber interior to be atmospheric, and the substrate was taken outside. In this manner, an image forming member D was obtained.

The thus obtained image forming member D was placed in the test device for charging and exposing, as is the case with Example 1 above, and subjected to the image forming test. There could be obtained on the image transfer paper a toner image of extremely good quality and high image contrast.

EXAMPLE 5

Under the same conditions and following the same procedures as in Example 1 above, the p+-type a-Si:H layer having a thickness of 0.2 micron and the i-type a-Si:H layer having a thickness of 4 microns were formed on the substrate. Thereafter, an electrically insulative layer consisting of a polycarbonate coating of 15 microns was formed on the i-type a-Si:H layer to thereby obtain an image forming member E.

Using this image forming member E, a clear toner image was formed on a plain paper through the continuous process steps of primary charging at −5,500 V, secondary discharging at +7,000 V simultaneous with image exposure with light of 0.7 lux·sec., image development, and the image transfer.

EXAMPLE 6

Using the deposition device as shown in FIG. 3 and following the same procedures as in Example 1 above, an image forming member F of the undermentioned layer construction was produced.

| | |
|---|---|
| Substrate | Stainless steel plate (200 mm × 200 mm) provided on its surface with a thin film of platinum having a thickness of 800 angstroms |
| Barrier layer | p+-type a-Si:H having a thickness of 0.25 micron ($B_2H_6/SiH_4$ = 100 vol. ppm.) |
| Photoconductive layer | i-type a-Si:H having a thickness of 10 microns ($B_2H_6/SiH_4$ = 10 vol. ppm.) |

This image forming member F was positively charged with 6 KV and subjected to an image exposure with light of 1 lux·sec. The latent image was then developed with a negatively charged developer, followed by transfer of the developed image onto a plain paper. An extremely high quality toner image could be obtained. When the image formation was repeated for 10,000 times in succession, no substantial deterioration could be observed in the image quality of the transferred toner image.

What we claim is:

1. A photoconductive member which comprises:
   (a) a substrate;
   (b) a photoconductive layer;
   (c) a barrier layer provided between said substrate and said photoconductive layer, and having a function of substantially inhibiting injection of carriers from the substrate side to the photoconductive layer; and
   (d) a depletion layer region created in the interfacial region of said photoconductive layer and said barrier layer,
   said photoconductive layer and said barrier layer being made of an amorphous material with silicon as a matrix and hydrogen as a constituent atom,
   a part of said barrier layer being present between the depletion layer region and the substrate in such a thickness that, in order to inhibit injection of carriers having the same polarity as that of the minority carriers in said barrier layer from said substrate side to said photoconductive layer, probability of said carriers reaching said depletion layer region from said substrate side may be substantially neglected, the photo-carriers in said photoconductive layer having the same polarity as that of majority carriers in said barrier layer, among said photo-carriers to be generated in said photoconductive layer by irradiation of electromagnetic waves, being caused to move in the direction of the barrier layer, said barrier layer having a layer thickness of from 0.02 to 0.5 microns and containing as impurity to govern the conductive type thereof an atom in Group III-A or V-A of the Periodic Table, and said photoconductive layer having a layer thickness of from 1 to 70 microns and a resistance value of $5 \times 10^9$ ohm-cm and greater, and containing as impurity to govern the conductive type thereof an atom in Group III-A of the Periodic Table, or not containing such impurity.

2. The photoconductive member as set forth in claim 1, wherein the impurity concentration to satisfy a relationship of (N-M)/N ranges from 0.5 to 1.0 (where: N is a quantity of the impurity contained in the barrier layer; and M is a quantity of the impurity contained in the photoconductive layer).

3. The photoconductive member as set forth in claim 1, wherein the impurity contained in said barrier layer ranges from 100 ppm to 1,000 ppm.

4. The photoconductive member as set forth in claim 1, wherein the impurity contained in said photoconductive layer is below 100 ppm.

5. The photoconductive member as set forth in claim 1, wherein a surface coating layer is further provided on said photoconductive layer.

6. A photoconductive member which comprises:
   (a) a substrate;
   (b) a photoconductive layer;
   (c) a barrier layer provided between said substrate and said photoconductive layer, and having a function of substantially inhibiting injection of carriers having the same polarity as that of minority carriers in said barrier layer from said substrate side to said photoconductive layer;
   and
   (d) a depletion layer region created in the interfacial region of said photoconductive layer and said barrier layer, said photoconductive layer and said barrier layer being made of an amorphous material with silicon as a matrix and hydrogen as a constituent atom, the photo-carriers in said photoconductive layer having the same polarity as that of majority carriers in said barrier layer, among photo-carriers to be generated in said photoconductive layer by irradiation of electromagnetic waves, being caused to move in the direction of the barrier layer, said barrier layer containing as impurity to govern the conductive type thereof an atom in Group III-A or V-A of the Periodic Table, said photoconductive layer containing an impurity to govern the conductive type thereof or not containing such impurity, and the impurity concentration to satisfy a relationship of (N-M)/N ranging from 0.5 to 1.0 (where: N is a quantity of the impurity contained in the barrier layer and M is a quantity of the impurity contained in the photoconductive layer).

7. The photoconductive member as set forth in claim 6, wherein the impurity contained in said barrier layer ranges from 100 ppm to 1,000 ppm.

8. The photoconductive member as set forth in claim 6, wherein the impurity contained in said photoconductive layer is below 100 PPM.

9. The photoconductive member as set forth in claim 6, wherein a surface coating layer is further provided on said photoconductive layer.

* * * * *